United States Patent
Murata

(10) Patent No.: US 10,483,113 B2
(45) Date of Patent: Nov. 19, 2019

(54) WIRING BOARD, TFT SUBSTRATE, METHOD FOR MANUFACTURING WIRING BOARD, AND METHOD FOR MANUFACTURING TFT SUBSTRATE

(71) Applicant: Sakai Display Products Corporation, Osaka (JP)

(72) Inventor: Ryo Murata, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 0 days.

(21) Appl. No.: 16/008,256

(22) Filed: Jun. 14, 2018

(65) Prior Publication Data
US 2018/0294160 A1 Oct. 11, 2018

Related U.S. Application Data

(63) Continuation-in-part of application No. PCT/JP2015/084956, filed on Dec. 14, 2015.

(51) Int. Cl.
*H01L 21/28* (2006.01)
*H01L 27/12* (2006.01)
(Continued)

(52) U.S. Cl.
CPC .. *H01L 21/28247* (2013.01); *H01L 21/28008* (2013.01); *H01L 27/124* (2013.01);
(Continued)

(58) Field of Classification Search
CPC ......... H01L 21/28247; H01L 29/42384; H01L 29/4908; H01L 29/78696; H01L 29/78606;
(Continued)

(56) References Cited

U.S. PATENT DOCUMENTS 5,737,049 A * 4/1998 Shin ..................... H01L 27/1255
349/122
6,605,496 B1 8/2003 Yamazaki
(Continued)

FOREIGN PATENT DOCUMENTS

JP H1197700 A 4/1999
JP 2000252472 A 9/2000
(Continued)

OTHER PUBLICATIONS

English Translation of PCT International Search Report, PCT Application No. PCT/JP2015/084956, Japan Patent Office. Feb. 23, 2016.

*Primary Examiner* — Dao H Nguyen
(74) *Attorney, Agent, or Firm* — Marsh Fischmann & Breyfogle LLP

(57) ABSTRACT

There is provided a TFT substrate that prevents corrosion of a gate electrode and a method for manufacturing the TFT substrate. The TFT substrate comprises a substrate; a gate comprising a gate electrode and a gate wiring, the gate comprising copper and formed on one surface of the substrate; a protection film to cover the gate; an insulation film formed on the protection film; a semiconductor film formed on the insulation film; and a source and a drain formed on the semiconductor film and facing each other with a space therebetween above the gate electrode, wherein the protection film covers entire exposed surface of the gate.

4 Claims, 10 Drawing Sheets

(51) Int. Cl.
*H01L 29/49* (2006.01)
*H01L 29/786* (2006.01)
*H01L 29/423* (2006.01)

(52) U.S. Cl.
CPC ........ *H01L 27/127* (2013.01); *H01L 27/1222* (2013.01); *H01L 29/42384* (2013.01); *H01L 29/4908* (2013.01); *H01L 29/78606* (2013.01); *H01L 29/78696* (2013.01); *H01L 2029/42388* (2013.01)

(58) Field of Classification Search
CPC ... H01L 29/789; H01L 27/127; H01L 27/124; H01L 27/1222
USPC ............. 257/72, 751, 59, 43, 40, E21.09, 257/E21.134, E21.312, E21.314, E21.414, 257/E27.016, E27.067, E27.111, E29.117, 257/E29.147, E29.151, E29.194, E29.285, 257/E33.003, E33.004, E33.012, E33.053; 349/141, 147, 43; 438/162, 166, 159, 438/479, 486
See application file for complete search history.

(56) References Cited

U.S. PATENT DOCUMENTS

| | | | |
|---|---|---|---|
| 6,956,236 | B1 | 10/2005 | Sasaki et al. |
| 7,804,174 | B2* | 9/2010 | Sasaki ............... G02F 1/136286 257/72 |
| 9,660,091 | B2* | 5/2017 | Kim .................. H01L 29/78648 |
| 2007/0102818 | A1 | 5/2007 | Sasaki et al. |
| 2007/0236641 | A1 | 10/2007 | Ning et al. |
| 2008/0316449 | A1* | 12/2008 | Adachi .................. G03B 27/00 355/53 |
| 2012/0127396 | A1* | 5/2012 | Tsubata ................ G02F 1/1345 349/61 |
| 2015/0079727 | A1 | 3/2015 | Lee et al. |
| 2018/0269332 | A1* | 9/2018 | Hu .......................... G09G 3/20 |

FOREIGN PATENT DOCUMENTS

| | | |
|---|---|---|
| JP | 2007281459 A | 10/2007 |
| JP | 4238956 B2 | 3/2009 |
| JP | 2010056136 A | 3/2010 |
| WO | 0036641 A1 | 6/2000 |

* cited by examiner

WIRING BOARD, TFT SUBSTRATE, METHOD FOR MANUFACTURING WIRING BOARD, AND METHOD FOR MANUFACTURING TFT SUBSTRATE

CROSS-REFERENCE TO RELATED APPLICATION

This is a continuation-in-part of PCT international application No. PCT/JP2015/084956 filed on Dec. 14, 2015, incorporated herein by reference.

TECHNICAL FIELD

The present technology relates to a wiring board provided with a wiring including coper, a TFT substrate, a method for manufacturing the wiring board, and a method for manufacturing the TFT substrate.

BACKGROUND ART

In recent years, a copper-including wiring has begun to be used for a wiring board, for example, a TFT (Thin Film Transistor) substrate. After the wiring is formed on the wiring board, corrosion due to oxidization may occur on the wiring when baking process is carried out in an atmosphere having a particular gas.

In order to prevent such corrosion, JP 4238956 B proposes using a copper wiring and a metal oxide conductor to form a wiring, and covering the copper wiring with the metal oxide conductor.

SUMMARY OF THE INVENTION

In a process of manufacturing the wiring board, however, after the metal oxide conductor and the copper wiring have been formed, unnecessary parts of these conductor and wiring are removed and thus the metal oxide conductor cannot cover a side surface of the copper wiring. Therefore, there is a risk that prevention of corrosion on the wiring becomes insufficient.

The present embodiment has been made in view of such circumstance described above, and an object of the present embodiment is to provide a wiring board, a TFT substrate, a method for manufacturing the wiring board, and a method for manufacturing the TFT substrate that can prevent corrosion of a wiring, for example, a gate.

A wiring board according to the present embodiment comprises a substrate; a wiring comprising copper and formed on one surface of the substrate; and a protection film to cover the wiring, wherein the protection film has a width being larger than a width of the wiring, and covers entire exposed surface of the wiring.

A TFT substrate according to the present embodiment comprises: a substrate; a gate comprising a gate electrode and a gate wiring, the gate comprising copper and formed on one surface of the substrate; a protection film to cover the gate; an insulation film formed on the protection film; a semiconductor film formed on the insulation film; and a source and a drain formed on the semiconductor film and facing each other with a space therebetween above the gate electrode, wherein the protection film covers entire exposed surface of the gate.

A method for manufacturing a wiring board according to the present embodiment comprises: forming a wiring comprising copper on one surface of a substrate; and forming a protection film on the wiring so as to cover entire exposed surface of the wiring, the protection film having a width larger than a width of the wiring.

A method for manufacturing a TFT substrate according to the present embodiment comprises: forming a gate comprising a gate electrode and a gate wiring on one surface of a substrate, the gate comprising copper; forming a protection film to cover the gate; forming an insulation film on the protection film; forming a semiconductor film on the insulation film; and forming a source and a drain on the semiconductor film in such a way the source and the drain facing each other with a space therebetween above the gate electrode, wherein the protection film is formed so as to cover entire exposed surface of the gate.

In the wiring board, the TFT substrate, the method for manufacturing the wiring board, and the method for manufacturing the TFT substrate according to the exemplary embodiments of the present invention, since entire exposed surface of the wiring is covered with the protection film having the width larger than the width of the wiring, corrosion of the wiring can be prevented.

DETAILED DESCRIPTION

Embodiment 1

A method for manufacturing a TFT (Thin Film Transistor) substrate and a TFT substrate according to Embodiment 1 will be described below with reference to the drawings. The TFT substrate is used in manufacture of a liquid crystal display panel, for example. FIG. 1A to FIG. 1L show cross-sectional views each showing the method for manufacturing the TFT substrate, and FIG. 2 shows a plan view corresponding to FIG. 1A. The cutting line 1A-1A shown in FIG. 2 indicates the cutting position for FIG. 1A.

The TFT substrate is manufactured in accordance with the following steps. First, a substrate 1, for example, a glass substrate is prepared, a metal film (gate electrode) 2 is formed on the whole of one surface of the substrate 1, a resist film 80 is formed on the whole of the one surface of the metal film 2, and prebaking is carried out. Then, exposure for the resist film 80 is carried out by irradiating the resist film 80 with light beams or electromagnetic waves (for example, ultraviolet rays) through a mask (not shown). Then, the resist film 80 is developed using development solution, and the resist film 80 partially remains at a predetermined part of the substrate 1 (see FIG. 1A and FIG. 2). Then, post-baking is carried out. Then, the metal film 2 is etched, a part of the metal film 2 which has been covered with the resist film 80 remains on the substrate 1, and a gate including a gate electrode 2 and a gate wiring is formed. After the etching, the resist film 80 is removed (see FIG. 1B). The gate electrode 2 protrudes from the one surface of the substrate 1. The metal film and the gate (the gate electrode 2 and the gate wiring) include copper.

Figure 1A:
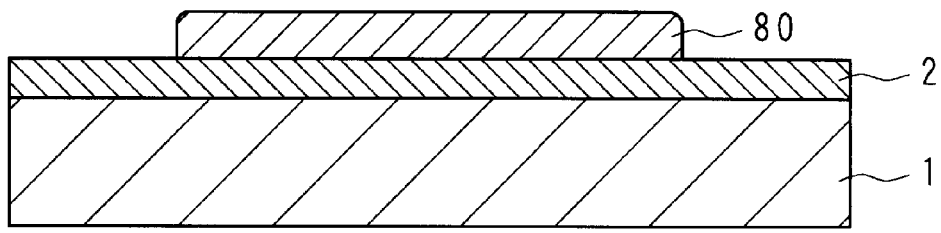
FIG. 1A shows a cross-sectional view showing a method for manufacturing a TFT substrate according to Embodiment 1.
Figure 1B:
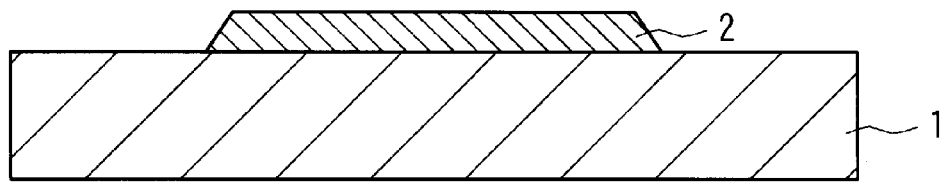
FIG. 1B shows a cross-sectional view showing the method for manufacturing the TFT substrate according to Embodiment 1.
Figure 1C:
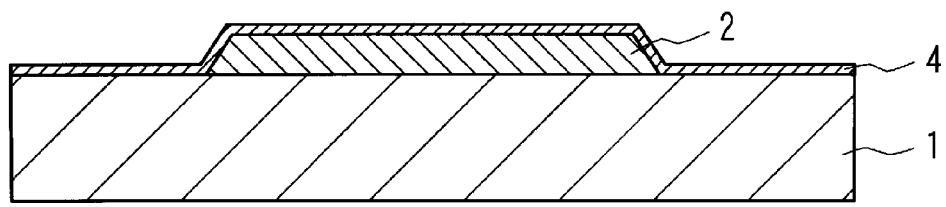
FIG. 1C shows a cross-sectional view showing the method for manufacturing the TFT substrate according to Embodiment 1.
Figure 2:
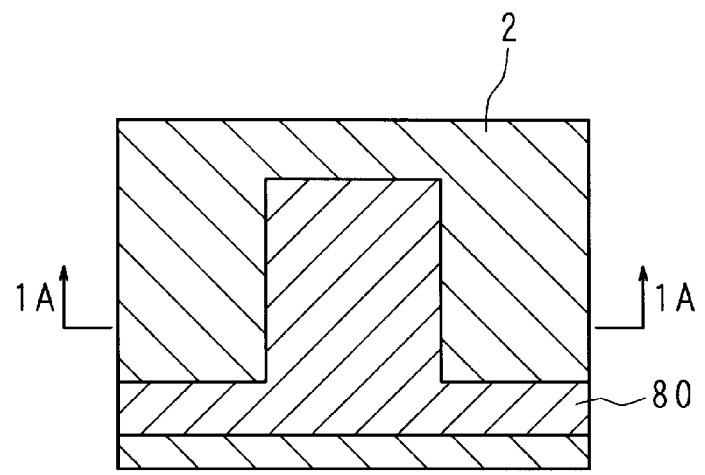
FIG. 2 shows a plan view corresponding to FIG. 1A

Next, a protection film 4 to protect the gate electrode 2 and the gate wiring from corrosion is formed on the gate and the one surface of the substrate 1 (see FIG. 1C). The protection film 4 is formed on substantially entire exposed surface of gate (the gate electrode 2 and the gate wiring) and the substrate 1. The protection film 4 is composed of, for example, chrome, nickel, titanium or an alloy thereof, thereby having a conductivity. The protection film 4 is preferably formed with a member having a reflectance which is lower than a reflectance of the gate electrode 2, and for example, the reflectance of the protection film 4 is lower than the reflectance of the gate electrode 2 relative to light which has a wavelength of 500 nm or more.

Figure 1D:
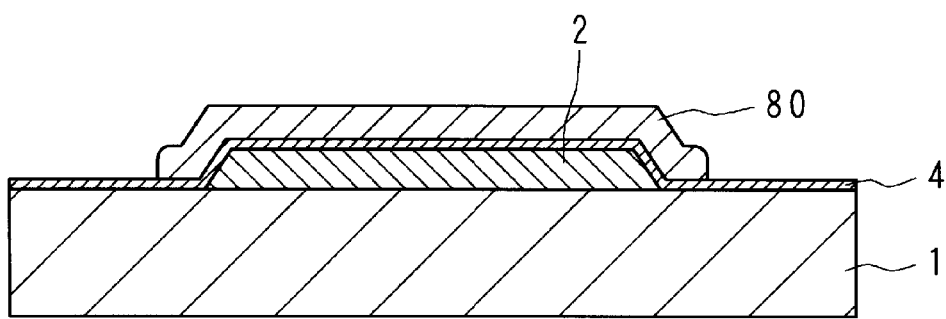
FIG. 1D shows a cross-sectional view showing the method for manufacturing the TFT substrate according to Embodiment 1.
Figure 1E:
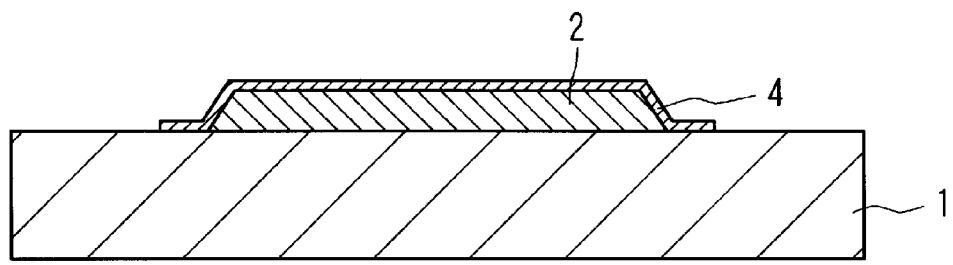
FIG. 1E shows a cross-sectional view showing the method for manufacturing the TFT substrate according to Embodiment 1.

Next, a resist film 80 is formed on a part of the protection film 4 corresponding to the gate (a part covering the gate) (see FIG. 1D). In the formation of the resist film 80, prebaking, exposure, development, and post-baking are carried out as described above. Then, the protection film 4 is etched, and the resist film 80 is removed after the etching. A part of the protection film 4, which has been covered with the resist film 80 remains on the substrate 1 (see FIG. 1E).

A width of the protection film 4 is larger than a width of the gate electrode 2, and the protection film 4 covers an edge part and a side surface of the gate (the gate electrode 2 and gate wiring) as well as one surface (a top surface in FIG. 1E) of the gate. Preferably, the width in any direction of the protection film 4 is larger than that of the gate. Although the gate electrode 2 and the gate wiring are exposed on the one surface (the surface on which a TFT is to be formed) of the substrate 1 before the protection film 4 is formed (see FIG. 1B), the protection film 4 covers entire exposed surface of the gate. As described above, the gate electrode 2 protrudes from the one surface of the substrate 1, and the protection film 4 has a shape along a shape of the gate electrode 2.

When the resist film 80 is formed on the part of the protection film 4 corresponding to the gate electrode 2 (see FIG. 1D), a mask (hereinafter referred to as a first mask) which has been used when the resist film 80 has been formed on the metal film 2 (see FIG. 1A) is used, or alternatively, a new mask (hereinafter referred to as a second mask) having an opening of which width is larger than the width of the gate electrode 2 is used. In a case where the first mask is used, manufacturing costs of the TFT substrate can be reduced. In a case where the second mask is used, the width of the protection film 4 can be easily made larger than the width of the gate electrode 2 compared to the case where the first mask is used for etching the protection film 4, and therefore, the protection film 4 can cover entire of the exposed surface of the gate electrode 2 more surely.

Figure 1F:
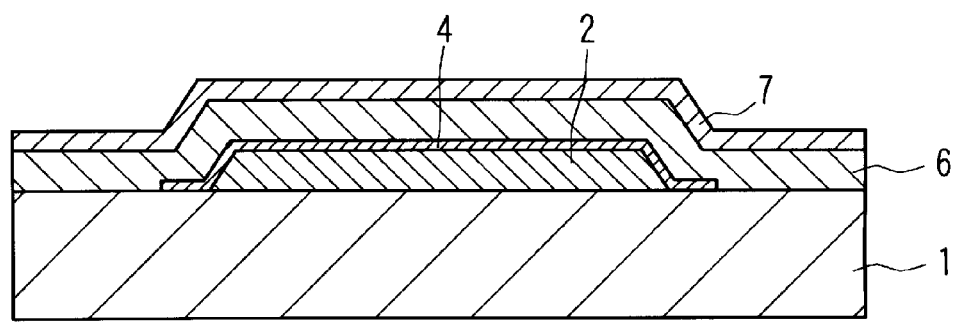
FIG. 1F shows a cross-sectional view showing the method for manufacturing the TFT substrate according to Embodiment 1.
Figure 1G:
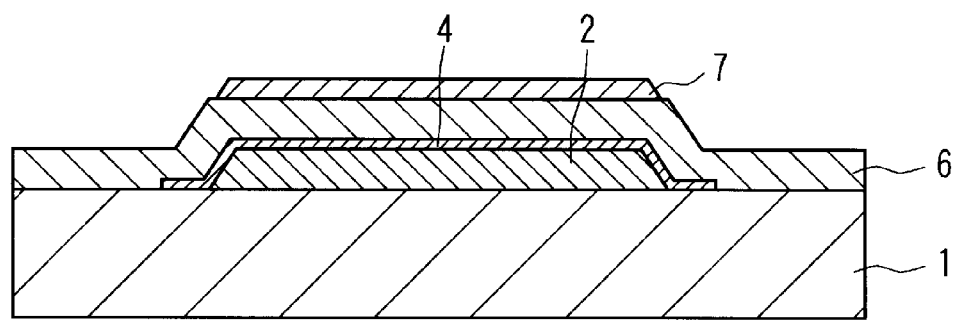
FIG. 1G shows a cross-sectional view showing the method for manufacturing the TFT substrate according to Embodiment 1.

Next, a gate insulation film 6 and a semiconductor film 7 are sequentially formed on the protection film 4 and the substrate 1 (see FIG. 1F). The gate insulation film 6 and the semiconductor film 7 each have a shape along the shape of the gate electrode 2 at a part covering the gate electrode 2, and each project upward (an opposite direction to the substrate 1) at the part covering the gate electrode 2. Then, the semiconductor film 7 is etched, and a part of the semiconductor film 7 covering the gate electrode 2 and the protection film 4 remains on the gate insulation film 6 (see FIG. 1G).

Figure 1H:
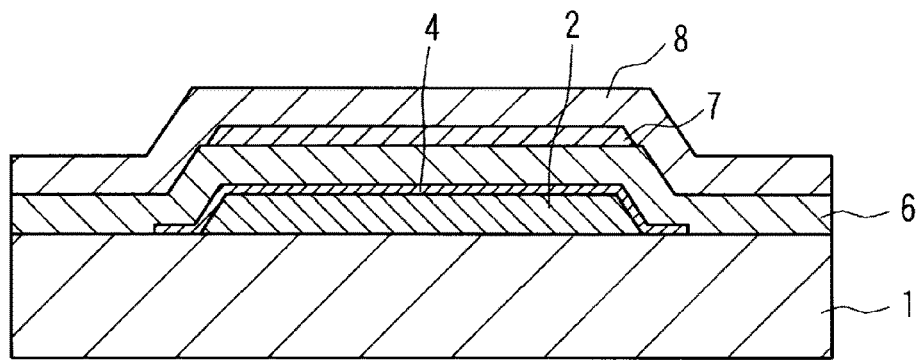
FIG. 1H shows a cross-sectional view showing the method for manufacturing the TFT substrate according to Embodiment 1.
Figure 1I:
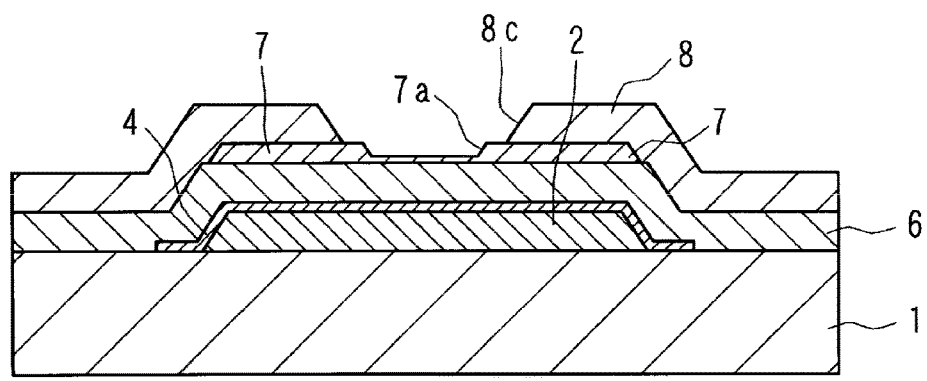
FIG. 1I shows a cross-sectional view showing the method for manufacturing the TFT substrate according to Embodiment 1.
Figure 1J:
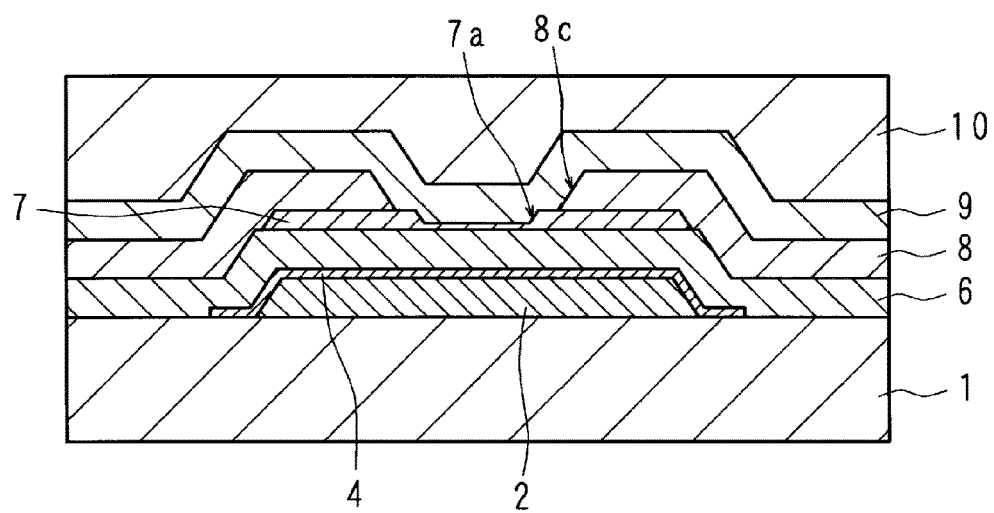
FIG. 1J shows a cross-sectional view showing the method for manufacturing the TFT substrate according to Embodiment 1.

Then, a conductive film 8 is formed on the gate insulation film 6 and the semiconductor film 7 (see FIG. 1H). The conductive film 8 has a shape along the shape of the gate electrode 2 at a part covering the gate electrode 2, and projects in the opposite direction to the substrate 1 (upward direction in FIG. 1A to FIG. 1L).

Next, the conductive film 8 and the semiconductor film 7 are etched, respectively. A slit 8c is formed at the part projecting upward in the conductive film 8. The slit 8c passes through the conductive film 8. In this etching process, inside the slit 8c, a concave portion 7a is also formed in the semiconductor film 7 (see FIG. 1I).

Then, a passivation film 9 and an organic insulation film 10 are sequentially formed on the conductive film 8 and the semiconductor film 7. At a part corresponding to the slit 8c and the concave portion 7a (a part covering the slit 8c and the concave portion 7a), the passivation film 9 has a shape along a shape of the slit 8c and a shape of the concave portion 7a. Namely, the passivation film 9 caves in at the part corresponding to the slit 8c and the concave portion 7a. The organic insulation film 10 fills up a concave of the passivation film 9 at the part corresponding to the slit 8c and the concave portion 7a (see FIG. 1J).

Figure 1K:
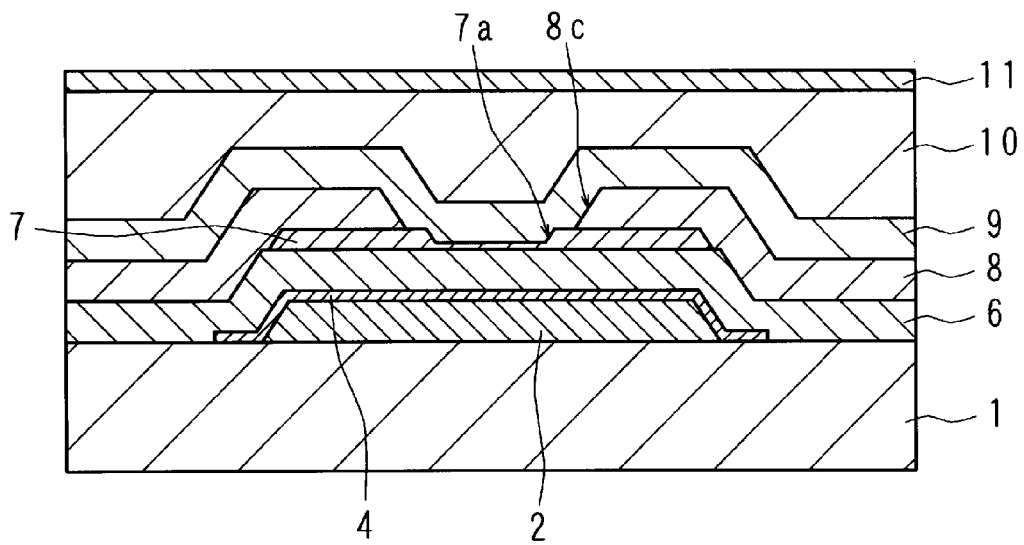
FIG. 1K shows a cross-sectional view showing the method for manufacturing the TFT substrate according to Embodiment 1.
Figure 1L:
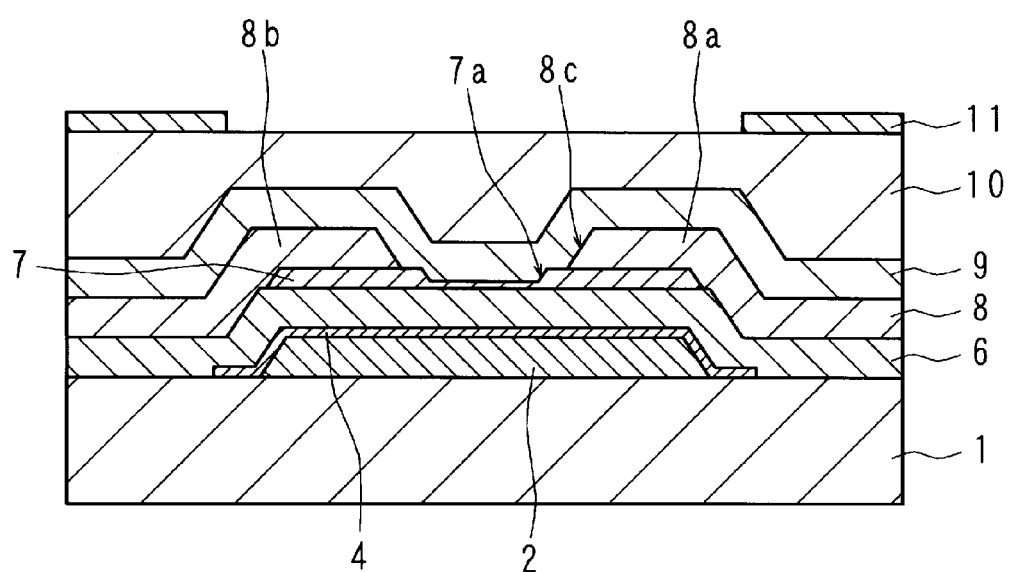
FIG. 1L shows a cross-sectional view showing the method for manufacturing the TFT substrate according to Embodiment 1.

Next, a transparent conductive film 11, for example, ITO (Indium Tin Oxide) is formed on the organic insulation film 10 (see FIG. 1K). Then, the transparent conductive film 11 is etched, thereby a part of the transparent conductive film 11, which corresponds to the gate electrode 2 (a part covering the gate electrode 2) is removed. Consequently, a TFT substrate is completed (see FIG. 1L). In the TFT substrate, either one of the two parts facing each other with the slit 8c in the conductive film 8 therebetween constitutes a drain 8a, and the other one of the two parts constitutes a source 8b. The drain 8a and the source 8b face each other above the gate electrode 2. A part of the semiconductor film 7 between the drain 8a and the source 8b constitutes a channel.

In the exemplary Embodiment 1, since the entire exposed surface of the gate including the gate electrode 2 (all the surfaces which do not come into contact with the substrate 1) is covered with the protection film 4 having the width which is larger than the width of the gate electrode 2, oxidization or corrosion of the gate electrode 2 caused by, for example, baking process can be prevented.

In a case where the TFT substrate is used in the display panel, external light may enter the display panel. A part of the external light after entering the display panel reflects within the display panel, emits to the outside, and degrades the display quality. According to Embodiment 1, the reflectance of the protection film 4 is preferably lower than the reflectance of the gate electrode 2 and thus the external light which has entered the display panel hardly emits to the outside. Therefore, degradation of the display quality can be suppressed.

Embodiment 2

Figure 3A:
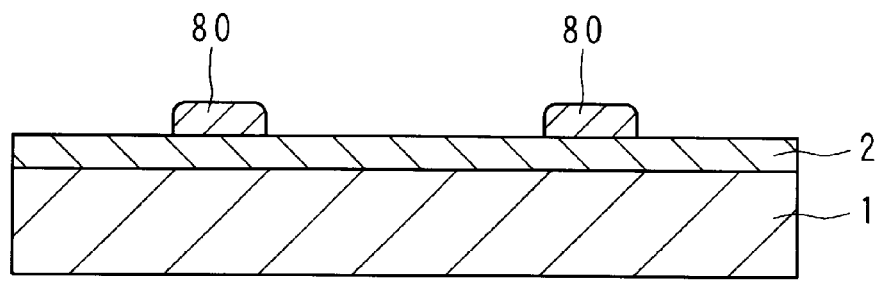
FIG. 3A shows a cross-sectional view showing a method for manufacturing a TFT substrate according to Embodiment 2.
Figure 3B:
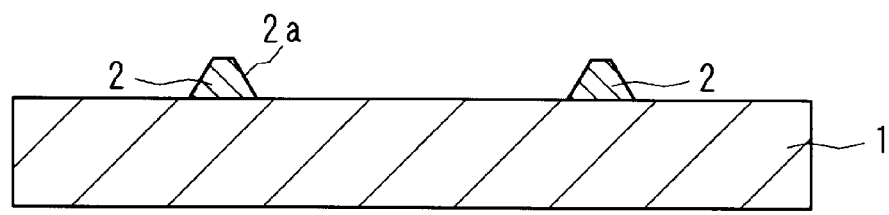
FIG. 3B shows a cross-sectional view showing the method for manufacturing the TFT substrate according to Embodiment 2.

A method for manufacturing a TFT substrate and a TFT substrate according to Embodiment 2 will be described below with reference to the drawings. Among the components according to Embodiment 2, the components same as those in Embodiment 1 are given the same reference numerals, and detailed description thereof is omitted. FIG. 3A to FIG. 3I show cross-sectional views showing the method for manufacturing the TFT substrate, and FIG. 4 shows a plan view corresponding to FIG. 3C. The cutting line 3C-3C shown in FIG. 4 indicates the cutting position for FIG. 3C.

The TFT substrate is manufactured in accordance with the following steps. First, a substrate 1 is prepared, a metal film 2 is formed on the whole of one surface of the substrate 1, a resist film 80 is formed on the whole of one surface of the metal film 2, and through, for example, prebaking, exposure, development, and post-baking, a resist pattern (resist film) 80 is formed on the one surface of the metal film 2 (see FIG. 3A). The resist pattern 80 is formed to form the gate electrode 2 having a planar shape indicated by the dashed line in FIG. 4. Therefore, an opening (a portion between two parts of the resist pattern 80 shown in FIG. 3A) corresponding to an opening 2a shown in FIG. 4 is provided in the resist pattern 80.

Then, the metal film 2 is etched, and the resist film 80 is removed after the etching. A part of the metal film 2 which has been covered with the resist film 80 remains on the substrate 1, thereby a gate including a gate electrode 2 and a gate wiring is formed. The gate electrode 2 and the gate wiring protrude from the one surface of the substrate 1 (see FIG. 3B). As indicated by dashed lines in FIG. 4 for example, the gate electrode 2 in a region in which a TFT is to be formed is formed integrally with the gate wiring (a lower part of the gate electrode 2 in FIG. 4, which extends in the horizontal direction in FIG. 4). A plurality of gate wirings (not shown) may be formed in parallel on the one surface of the substrate 1. And in the region in which the TFT is to be formed, the gate electrode 2 projects, from the gate wiring formed integrally with the gate electrode 2, in a direction toward other gate wiring adjacent thereto on the surface of the substrate 1. That direction can be a direction toward a pixel region or a direction substantially orthogonal to the gate wiring. In addition, the gate electrode 2 in this region can have a shape in which a plurality of slot-shaped openings 2a are provided in the gate electrode 2 shown in IG. 2 of Embodiment 1, and the gate electrode 2 in this region can have a ladder shape.

Figure 3C:
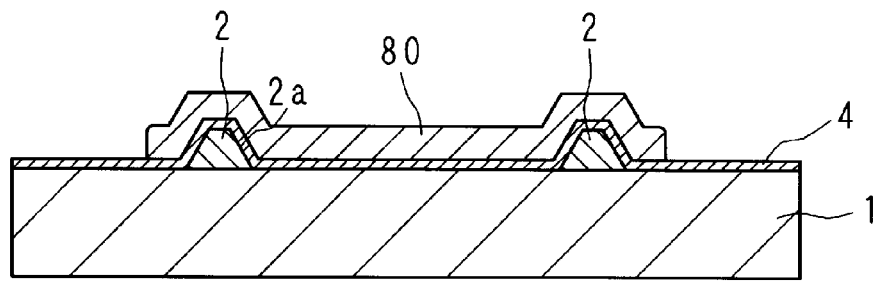
FIG. 3C shows a cross-sectional view showing the method for manufacturing the TFT substrate according to Embodiment 2.
Figure 3D:
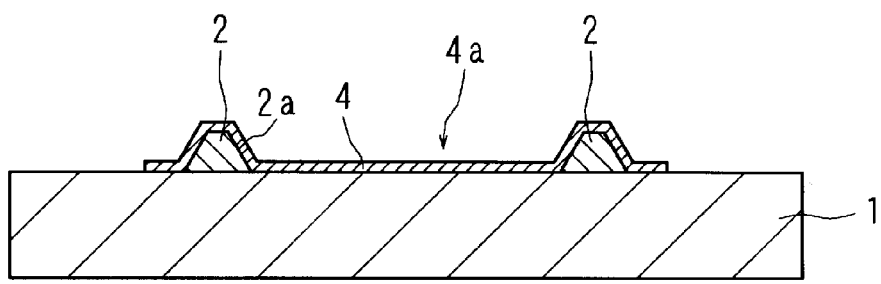
FIG. 3D shows a cross-sectional view showing the method for manufacturing the TFT substrate according to Embodiment 2.
Figure 3E:
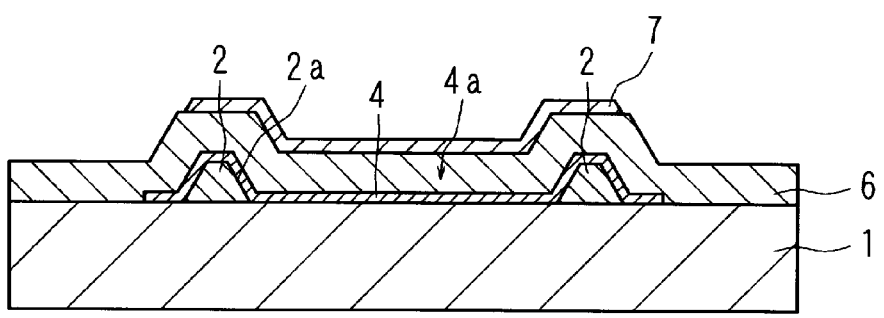
FIG. 3E shows a cross-sectional view showing the method for manufacturing the TFT substrate according to Embodiment 2.
Figure 4:
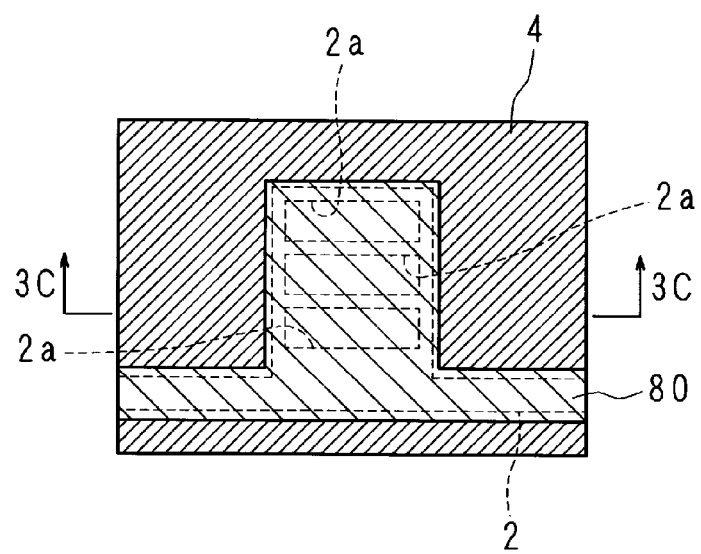
FIG. 4 shows a plan view corresponding to FIG. 3C.

Next, a protection film 4 is formed on the one surface of the substrate 1 and entire exposed surface of the gate electrode 2, and a resist film 80 is formed, above the ladder-shaped gate electrode 2 and the slot-shaped opening 2a, on the protection film 4 (see FIG. 3C and FIG. 4). The resist film 80 is larger than the ladder-shaped gate electrode 2 and extends to the outside of the gate electrode 2.

Then, the protection film 4 is etched, and the resist film 80 is removed after the etching. A part of the protection film 4 which has been covered with the resist film 80 remains on the substrate 1 (see FIG. 3D). The remaining protection film 4 covers entire exposed surface of the gate. For example, the remaining protection film 4 covers the slot-shaped opening 2a and entire of the exposed surface of the ladder-shaped gate electrode 2 on the one surface of the substrate 1. Also, the remaining protection film 4 partially fills the slot-shaped opening 2a and has a concave portion 4a at the slot-shaped opening 2a.

A gate insulation film 6 is formed so as to cover the one surface of the substrate 1 and entire exposed surface of the protection film 4, and a semiconductor film 7 is formed on the gate insulation film 6. The semiconductor film 7 is formed over the ladder-shaped gate electrode 2 and the slot-shaped opening 2a (see FIG. 3E). Over the slot-shaped opening 2a, the gate insulation film 6 and the semiconductor film 7 each caves in along the shape of the concave portion 4a.

Figure 3F:
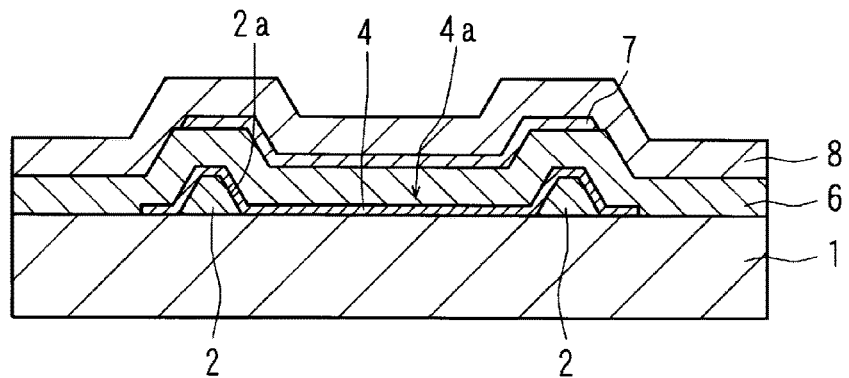
FIG. 3F shows a cross-sectional view showing the method for manufacturing the TFT substrate according to Embodiment 2.
Figure 3G:
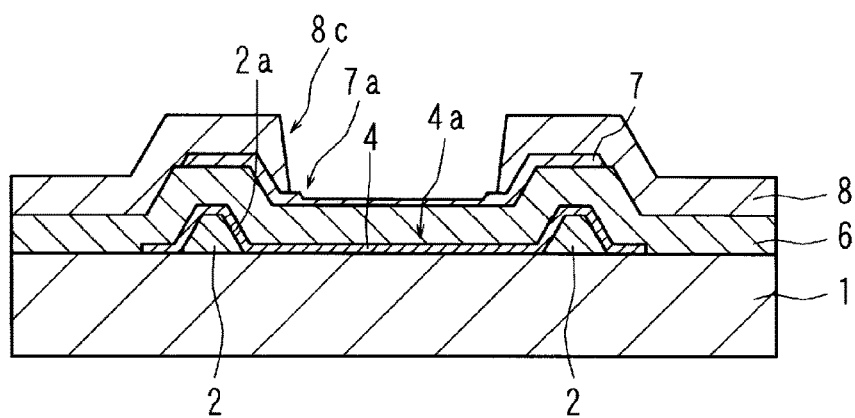
FIG. 3G shows a cross-sectional view showing the method for manufacturing the TFT substrate according to Embodiment 2.
Figure 3H:
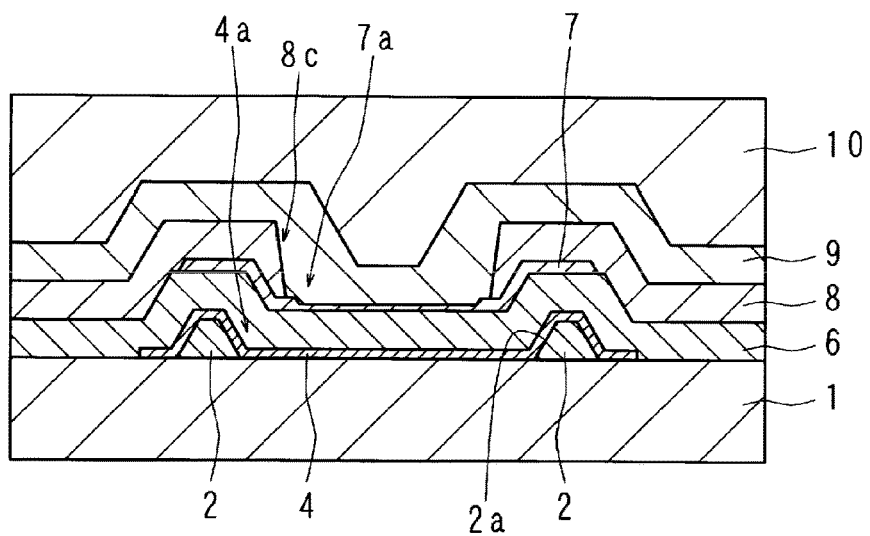
FIG. 3H shows a cross-sectional view showing the method for manufacturing the TFT substrate according to Embodiment 2.
Figure 3I:
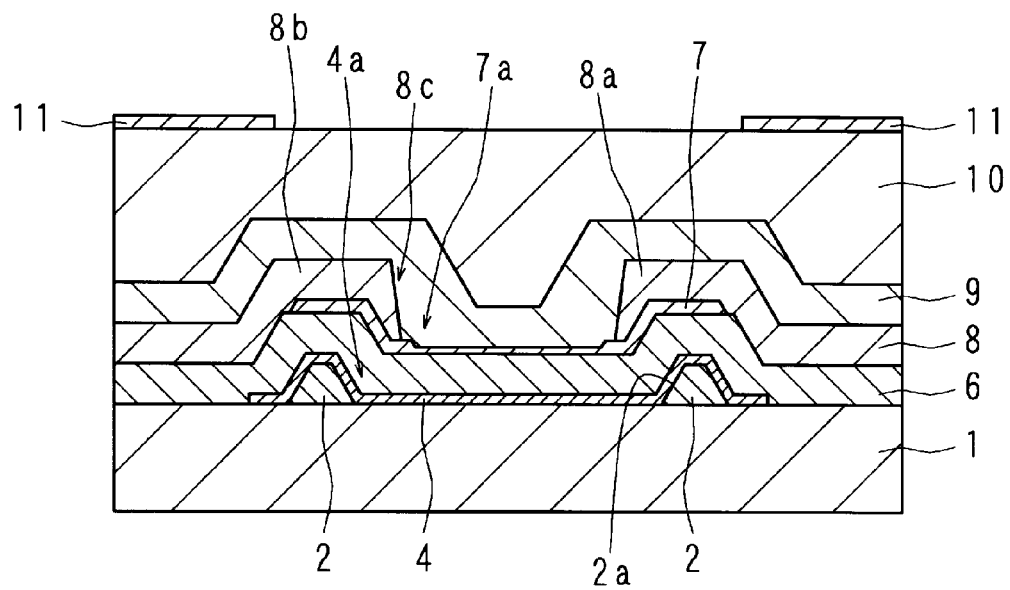
FIG. 3I shows a cross-sectional view showing the method for manufacturing the TFT substrate according to Embodiment 2.

Next, a conductive film 8 is formed on entire of the top surface (a surface oriented in the opposite direction to the substrate 1) of the gate insulation film 6 and the semiconductor film 7 (see FIG. 3F). Over the slot-shaped opening 2a, the conductive film 8 caves in along the concave portion 4a. Etching is carried out relative to a concave of the conductive film 8 and the semiconductor film 7. Thereby a slit 8c passing through the conductive film 8 is formed in the conductive film 8. Inside the slit 8c, a concave portion 7a is formed in the semiconductor film 7 (see FIG. 3G).

A passivation film 9 and an organic insulation film 10 are sequentially formed on entire of the top surface of the conductive film 8 and the semiconductor film 7. At a part corresponding to the slit 8c and the concave portion 7a (a part covering the slit 8c and the concave portion 7a), the passivation film 9 has a shape along the slit 8c and the concave portion 7a. Namely, the passivation film 9 caves in at the part corresponding to the slit 8c and the concave portion 7a. The organic insulation film 10 fills up a concave of the passivation film 9, and hardly caves in at the part corresponding to the slit 8c and the concave portion 7a (see FIG. 3H).

Next, a transparent conductive film 11 is formed on the organic insulation film 10, and the transparent conductive film 11 is etched, thereby a part of the transparent conductive film 11, which corresponds to the gate electrode 2 (a part covering the ladder-shaped gate electrode 2 including the opening 2a) is removed. Consequently, a TFT substrate is completed (see FIG. 3I). In the TFT substrate, either of two parts facing each other with the slit 8c in the conductive film 8 therebetween constitutes a drain 8a, and the other of the two parts constitutes a source 8b. A part of the semiconductor film 7 between the drain 8a and the source 8b constitutes a channel.

In the exemplary Embodiment 2, the protection film 4 may has a conductivity. As described above, the protection film 4 is provided in such a way that the protection film 4 partially fills the opening 2a provided in the gate electrode 2. The concave portion 4a of the protection film 4 is formed at the part covering the opening 2a. The gate insulation film 6 and the semiconductor film 7 are formed so as to cave in along the concave portion 4a. And the channel is formed at a region in the semiconductor film 7, which includes a portion in which the semiconductor film 7 caves in (that is, the concave portion 7a). The channel has a three-dimensional shape and thus the channel width is larger in comparison with a case in which the channel has a planar shape.

Embodiment 3

A method for manufacturing a TFT substrate and a TFT substrate according to Embodiment 3 will be described below with reference to the drawings. Through the following description about Embodiment 3, a signal input part of the TFT substrate in the same process as that in Embodiment 1 will be mainly described. Among the components according to Embodiment 3, the components same as those in Embodiment 1 or 2 are given the same reference numerals, and detailed description thereof is omitted.

Figure 5A:
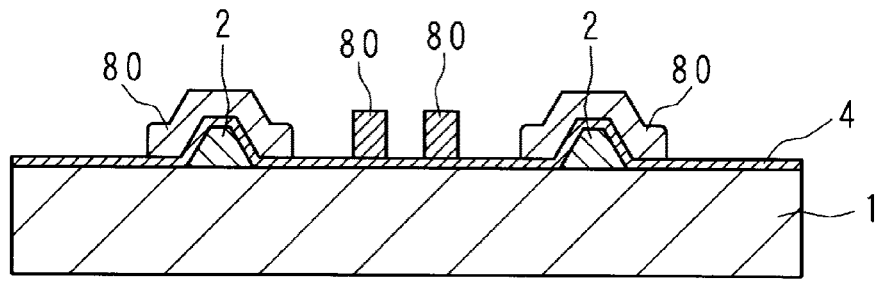
FIG. 5A shows a cross-sectional view showing a method for manufacturing a signal input part of a TFT substrate according to Embodiment 3.
Figure 5B:
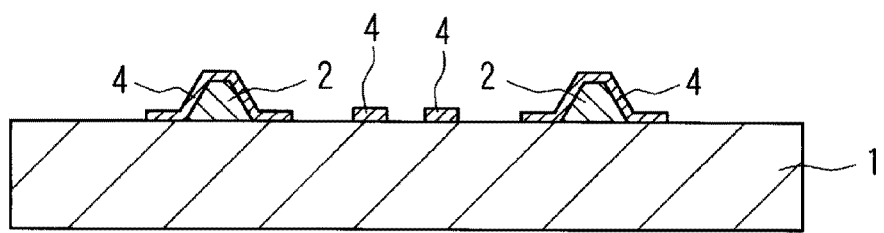
FIG. 5B shows a cross-sectional view showing the method for manufacturing the signal input part of the TFT substrate according to Embodiment 3.
Figure 5C:
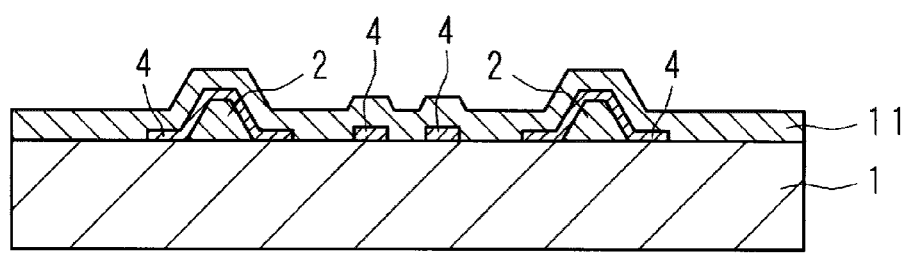
FIG. 5C shows a cross-sectional view showing the method for manufacturing the signal input part of the TFT substrate according to Embodiment 3.
Figure 5D:
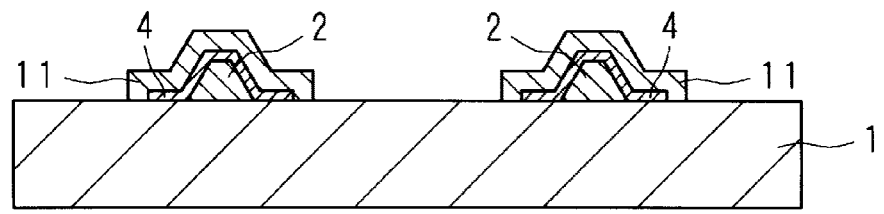
FIG. 5D shows a cross-sectional view showing the method for manufacturing the signal input part of the TFT substrate according to Embodiment 3.
Figure 6:
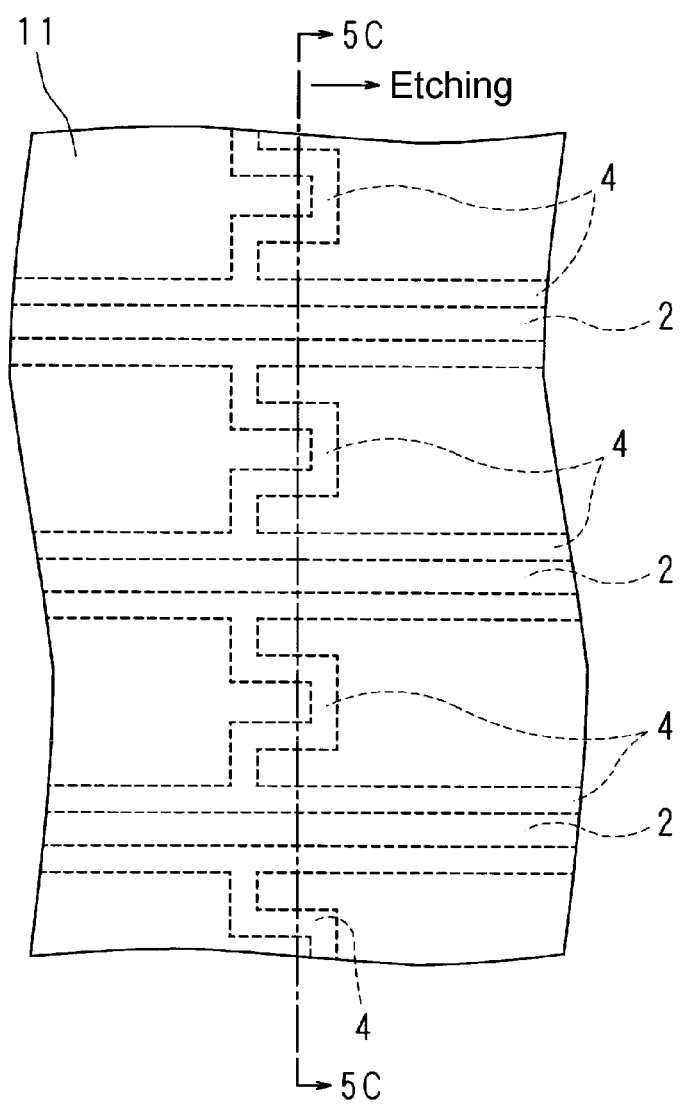
FIG. 6 shows a plan view corresponding to FIG. 5C.

FIG. 5A to FIG. 5D show cross-sectional views showing a method for manufacturing a signal input part in a TFT substrate, in which a TFT is not formed, and FIG. 6 is a plan view corresponding to FIG. 5C and shows a region of the TFT substrate, in which TFT is not formed. In FIG. 6, the right side of this drawing with respect to the single-dotted chain line 5C-5C represents a region to be etched for cutting a short ring described below. As shown in FIG. 6, in the signal input part, a plurality of gate wirings (gate electrodes 2) are formed. Namely, a plurality of gate are formed in such a way that a plurality of the gate wirings are arranged in parallel in the direction substantially orthogonal to the direction in which each of the gate wiring extends. A cross section of the signal input part, in the manufacturing process, at a cutting line along the direction in which the plurality of gate wirings are arranged in parallel may not be exactly the same as the cross section shown in FIG. 3A and FIG. 3B. However, in the following description, reference is made to FIG. 3A and FIG. 3B as needed because the components and the positional relationship therebetween shown in FIG. 3A and FIG. 3B can be similar to those in the cross section of the signal input part according to Embodiment 3.

First, as in Embodiment 2, a substrate 1 is prepared, a metal film 2 is formed on the whole of one surface of the substrate 1, a resist film 80 is formed on the whole of one surface of the metal film 2, and through, for example, prebaking, exposure, development, and post-baking, the resist film 80 having predetermined pattern is formed on the one surface of the metal film 2 (see FIG. 3A). The resist film 80 is formed so as to have an opening (a portion between two parts of the resist film 80 shown in FIG. 3A) at the signal input part.

Then, the metal film 2 is etched, and the resist film 80 is removed after the etching. A part of the metal film 2 which has been covered with the resist film 80 remains on the substrate 1, thereby a plurality of gates (gate wirings and gate electrodes 2) are formed apart from each other on the substrate 1 (see FIG. 3B). The gate electrodes 2 protrude from the one surface of the substrate 1.

Next, a protection film 4 is formed on the one surface of the substrate 1 and entire exposed surface of the gate electrode 2, and a resist film 80 is formed at a part covering the gate electrode 2 and between two adjacent gate electrodes 2 on the protection film 4 (see FIG. 5A). The resist film 80 covering the gate electrode 2 via the protection film 4 is formed so as to have a width larger than a width of the gate electrode 2. The resist film 80 on the protection film 4 is formed for patterning the protection film 4 into, for example, a planar shape shown in FIG. 6. The resist film 80 provided between the two adjacent gate electrodes 2 can be formed so as to have a U-shaped part which has two parts extending along a direction in which the gate wirings extend, and so as to connect two parts of the resist film 80 respectively covering the two adjacent gate wirings.

Next, some processes are carried out for the gate electrode 2 and the protection film 4 in a similar manner to that in each embodiment described above, thereby the gates are covered with the protection film 4 patterned into the predetermined planar shape (see FIG. 5B). Through these processes, the protection film 4 is patterned using the resist film 80 which has been formed as described above, therefore, a short ring which connects the adjacent gate wirings with each other can be formed of the protection film 4 (see FIG. 6). The short ring formed of the protection film 4 has, between the two adjacent gate wirings, a U-shaped part which has two parts extending along the direction in which the gate wirings extend. Since the short ring is formed of the protection film 4, the short ring can be cut by only removing, through etching process for example, a part of the protection film 4 which forms the short ring.

Then, in the region in which a TFT is formed, as shown in FIG. 3E to FIG. 3I for example, a gate insulation film 6, a semiconductor film 7, a drain 8a, a source 8b, a passivation film 9, an organic insulation film 10, and a transparent conductive film 11 are formed. In the signal input part, the transparent conductive film 11 is formed so as to cover the one surface of the substrate 1 and entire exposed surface of the protection film 4 as shown in FIG. 5C and FIG. 6.

Then, the transparent conductive film 11 is etched, and a part of the transparent conductive film 11 which covers the gate electrode 2 remains (see FIG. 5D). The transparent conductive film 11 covers the entire surface of the protection film 4 covering the gate electrode 2.

In a case where the short ring is formed of the protection film 4 as described above, when the transparent conductive film 11 is etched, the short ring can be cut by removing the protection film 4 (at least a turnaround part in the U-shaped part) forming the short ring partially and located at, for example, the right side from the single-dotted chain line 5C-5C shown in FIG. 6. Conventionally, in order to cut the short ling, a step for cutting short ring using, for example, laser beam has been needed. According to the exemplary Embodiment 3, this step can be omitted.

In addition, it should be appreciated that static electricity to be prone to remain on the TFT substrate can be suppressed by removing the protection film 4 at the later step of the manufacturing process.

In the exemplary Embodiment 3 as well, since entire exposed surface of each of the gates is covered with the protection film 4 having a width which is larger than a width of the gate electrode 2, oxidization or corrosion of the gate electrode 2 caused by, for example, baking process can be prevented.

It should be appreciated that the embodiments disclosed in this specification are intended to be illustrative and not restrictive in all respects. In addition, various specific technical features described in the above embodiments can be combined in any suitable manner, and all modifications within the scope of the claims and scope equivalent to the scope of the claims are intended to be included in the scope of the present invention.

The invention claimed is:

1. A TFT substrate comprising:
   a substrate;
   a gate comprising a gate electrode and a gate wiring, the gate comprising copper and formed on one surface of the substrate;
   a protection film to cover the gate;
   an insulation film formed on the protection film;
   a semiconductor film formed on the insulation film; and
   a source and a drain formed on the semiconductor film and facing each other with a space therebetween above the gate electrode,
   wherein the protection film covers an entire exposed surface of the gate,
   an opening is formed in the gate electrode,
   the protection film is provided so as to partially fill the opening,
   the semiconductor film comprises a channel between the source and the drain, and
   the channel is formed at a concave portion of the semiconductor film, the concave portion having a shape along the opening.

2. The TFT substrate according to claim 1, wherein the protection film is formed with a member having a reflectance lower than a reflectance of the gate electrode.

3. A method for manufacturing a TFT substrate comprising:
   forming a gate comprising a gate electrode and a gate wiring on one surface of a substrate, the gate comprising copper;
   forming a protection film to cover the gate;
   forming an insulation film on the protection film;
   forming a semiconductor film on the insulation film; and
   forming a source and a drain on the semiconductor film in such a way that the source and the drain face each other with a space therebetween above the gate electrode,
   wherein the protection film is formed so as to cover an entire exposed surface of the gate,
   a plurality of the gates are formed in such a way that a plurality of the gate wirings are arranged in parallel,
   the protection film has a conductivity, and
   a short ring to connect the gate wirings adjacent to each other is formed of the protection film.

4. The method for manufacturing a TFT substrate according to claim 3,
   further comprising forming a transparent conductive film, wherein the short ring is cut by removing a part of the protection film during an etching of the transparent conductive film.

* * * * *